(12) United States Patent
Hashigami

(10) Patent No.: US 11,990,521 B2
(45) Date of Patent: May 21, 2024

(54) LAMINATE, SEMICONDUCTOR DEVICE, AND METHOD FOR MANUFACTURING LAMINATE

(71) Applicant: SHIN-ETSU CHEMICAL CO., LTD., Tokyo (JP)

(72) Inventor: Hiroshi Hashigami, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 18/121,680

(22) Filed: Mar. 15, 2023

(65) Prior Publication Data

US 2023/0223446 A1 Jul. 13, 2023

Related U.S. Application Data

(63) Continuation of application No. 17/272,873, filed as application No. PCT/JP2019/035415 on Sep. 9, 2019.

(30) Foreign Application Priority Data

Sep. 27, 2018 (JP) ................................ 2018-182714

(51) Int. Cl.
*H01L 29/22* (2006.01)
*C01G 15/00* (2006.01)
(Continued)

(52) U.S. Cl.
CPC ........ *H01L 29/2206* (2013.01); *C01G 15/006* (2013.01); *H01L 21/0242* (2013.01);
(Continued)

(58) Field of Classification Search
CPC ............. H01L 29/2206; H01L 21/0242; H01L 21/02433; H01L 21/02483;
(Continued)

(56) References Cited

U.S. PATENT DOCUMENTS

2003/0134154 A1* 7/2003 Kirino ............... G11B 11/10586
428/832
2006/0225775 A1 10/2006 Ishihara
(Continued)

FOREIGN PATENT DOCUMENTS

JP H11-265853 A 9/1999
JP 2004-296598 A 10/2004
(Continued)

OTHER PUBLICATIONS

Dec. 3, 2019 International Search Report issued in International Patent Application No. PCT/JP2019/035415.
(Continued)

*Primary Examiner* — Mohammad A Rahman
(74) *Attorney, Agent, or Firm* — Oliff PLC

(57) ABSTRACT

A laminate contains a crystal substrate; a middle layer formed on a main surface of the crystal substrate, the middle layer comprising a mixture of an amorphous region in an amorphous phase and a crystal region in a crystal phase having a corundum structure mainly made of a first metal oxide; and a crystal layer formed on the middle layer and having a corundum structure mainly made of a second metal oxide, wherein the crystal region is an epitaxially grown layer from a crystal plane of the crystal substrate.

15 Claims, 7 Drawing Sheets

(51) Int. Cl.
*H01L 21/02* (2006.01)
*H01L 29/739* (2006.01)
*H01L 29/778* (2006.01)
*H01L 29/78* (2006.01)

(52) U.S. Cl.
CPC .. *H01L 21/02433* (2013.01); *H01L 21/02483* (2013.01); *H01L 21/02496* (2013.01); *H01L 29/78* (2013.01); H01L 21/0262 (2013.01); H01L 29/7395 (2013.01); H01L 29/7786 (2013.01)

(58) Field of Classification Search
CPC .............. H01L 21/02496; H01L 29/78; H01L 21/0262; H01L 29/7395; H01L 29/7786; H01L 29/1079; H01L 21/02488; H01L 21/02502; H01L 21/02513; H01L 21/02565; H01L 21/02628; H01L 29/66969; H01L 29/7828; H01L 29/24; H01L 29/872; H01L 33/26; H01L 21/365; H01L 21/338; H01L 21/368; H01L 29/12; H01L 29/739; H01L 29/778; H01L 29/812; H01L 33/12; C01G 15/006
See application file for complete search history.

(56) References Cited

U.S. PATENT DOCUMENTS

| | | | |
|---|---|---|---|
| 2011/0049467 A1 | 3/2011 | Cho et al. | |
| 2011/0052826 A1 | 3/2011 | Shimoda | |
| 2012/0319160 A1* | 12/2012 | Lester | H01L 33/007 438/46 |
| 2015/0099124 A1* | 4/2015 | Beunet | C03C 10/0045 65/30.14 |
| 2015/0171179 A1 | 6/2015 | Horii et al. | |
| 2015/0225845 A1 | 8/2015 | Park et al. | |
| 2016/0149005 A1* | 5/2016 | Oda | C01G 15/006 117/88 |
| 2017/0278706 A1 | 9/2017 | Oda et al. | |
| 2018/0226472 A1 | 8/2018 | Oda et al. | |
| 2020/0127199 A1 | 4/2020 | Barlas et al. | |

FOREIGN PATENT DOCUMENTS

| | | |
|---|---|---|
| JP | 5793732 B2 | 10/2015 |
| JP | 2016-066756 A | 4/2016 |
| JP | 2016-100592 A | 5/2016 |
| JP | 2017-054654 A | 3/2017 |
| JP | 2017-118090 A | 6/2017 |
| WO | 2015/005202 A1 | 1/2015 |
| WO | 2016/035696 A1 | 3/2016 |

OTHER PUBLICATIONS

Apr. 13, 2021 Office Action issued in Japanese Patent Application No. 2018-182714.
Mar. 23, 2021 International Preliminary Report on Patentability issued in International Patent Application No. PCT/JP2019/035415.
Apr. 26, 2022 Office Action issued in Japanese Patent Application No. 2021-110457.
May 2, 2022 extended Search Report issued in European Patent Application No. 19867010.1.
Sep. 15, 2022 Office Action issued in Indian Patent Application No. 202147007696.
Oct. 11, 2022 Office Action issued in Japanese Patent Application No. 2021-110457.
Jan. 6, 2023 Office Action issued in Taiwanese Patent Application No. 108134846.
U.S. Appl. No. 17/272,873, filed Mar. 2, 2021 in the name of Hashigami.
U.S. Appl. No. 18/121,691, filed Mar. 15, 2023 in the name of Hashigami.
Jun. 5, 2023 Office Action issued In U.S. Appl. No. 17/272,873.
Aug. 17, 2023 Office Action issued in U.S. Appl. No. 18/121,691.
Jan. 4, 2024 Office Action issued in Korean Application No. 10-2021-7007405.
Sato et al., "Hydrostatic compression of four corundumtype compounds: aAl2O3, V2O3, Cr2O3, and aFe2O3", J. Appl. Phys. 50, 5285 (1979).

* cited by examiner

[FIG. 1]
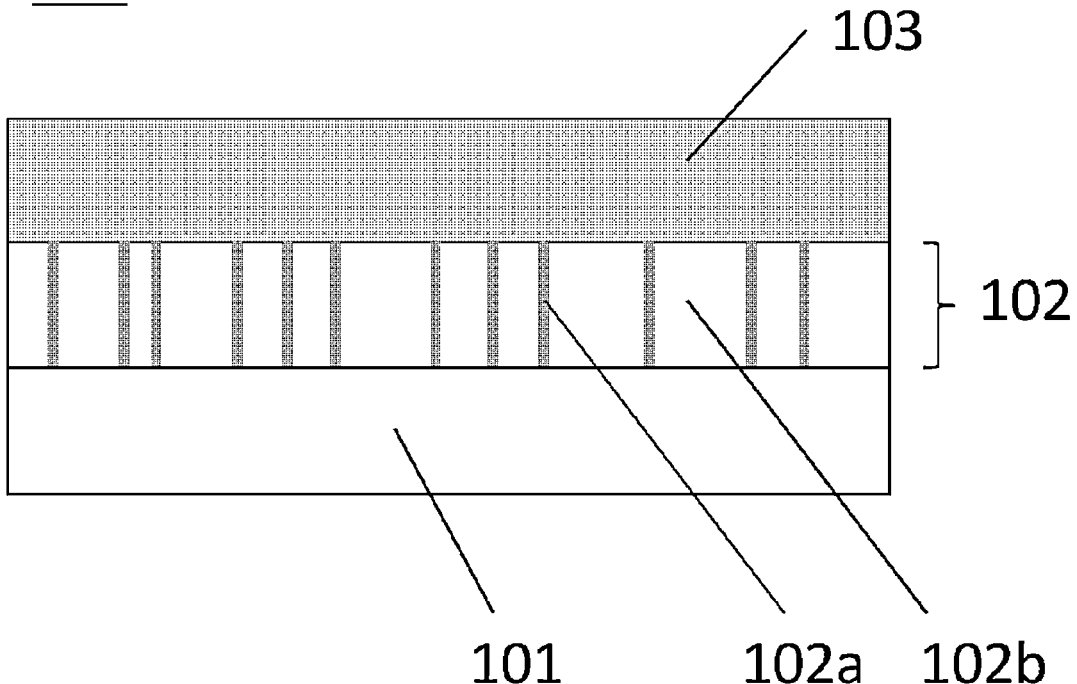
[FIG. 2]
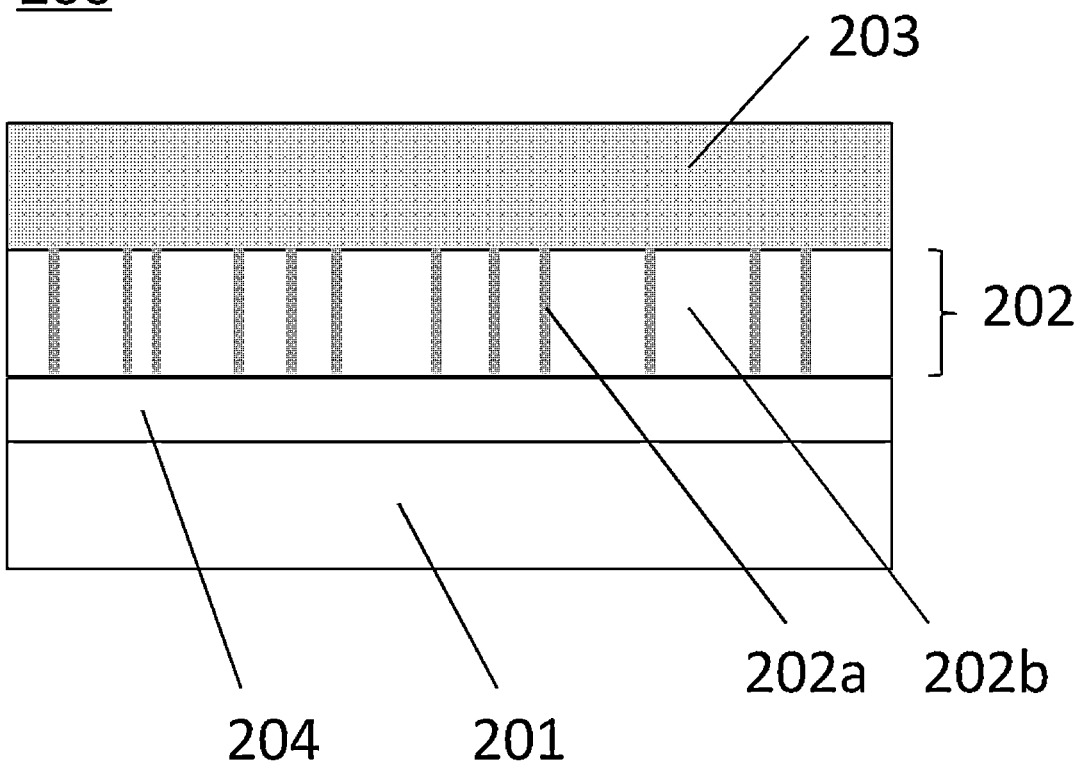

[FIG. 3]
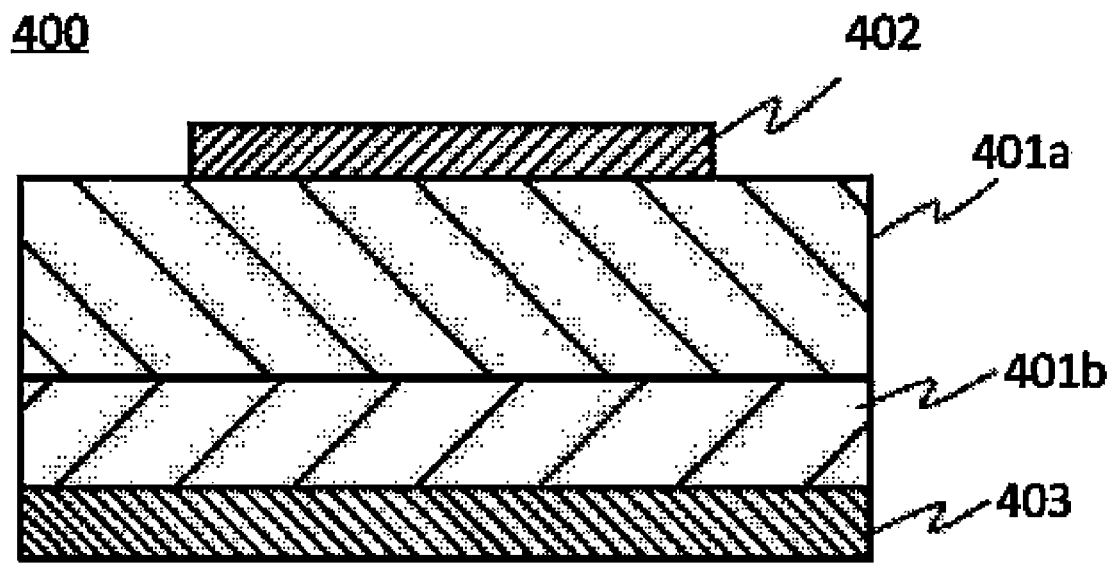
[FIG. 4]
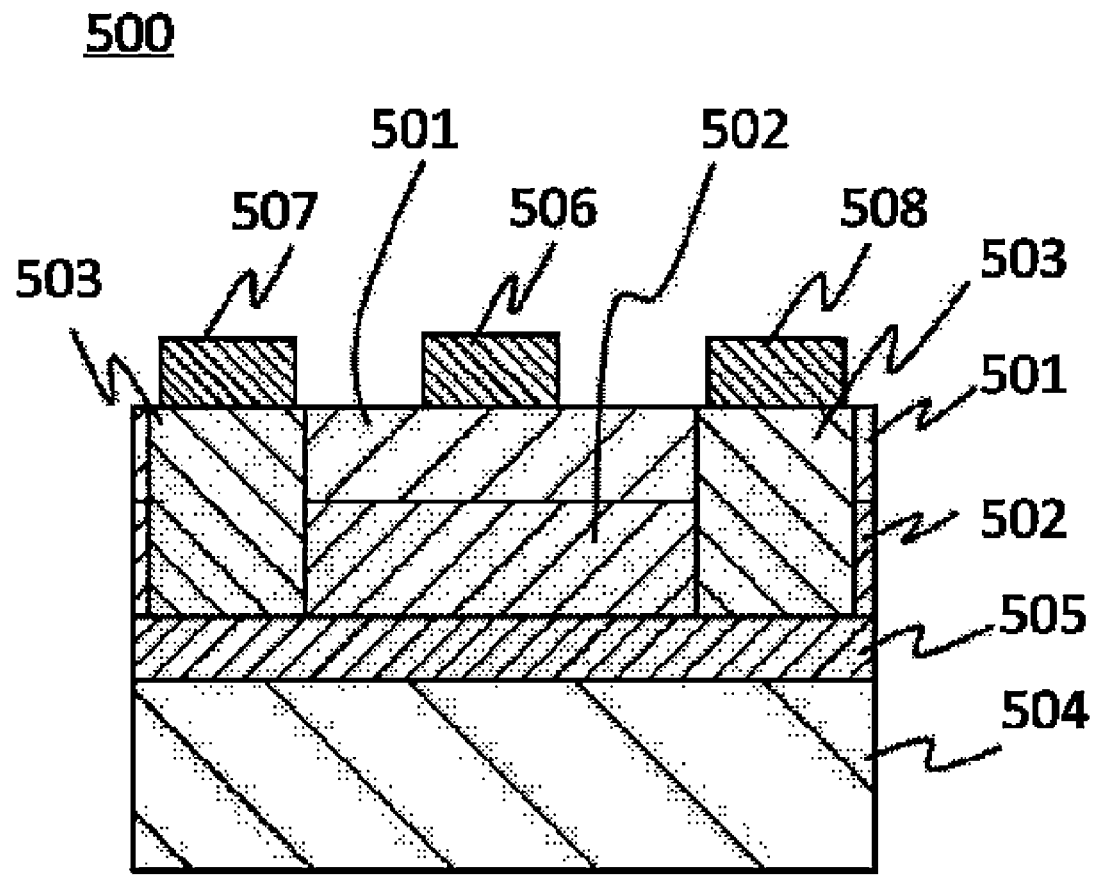

[FIG. 5]
600
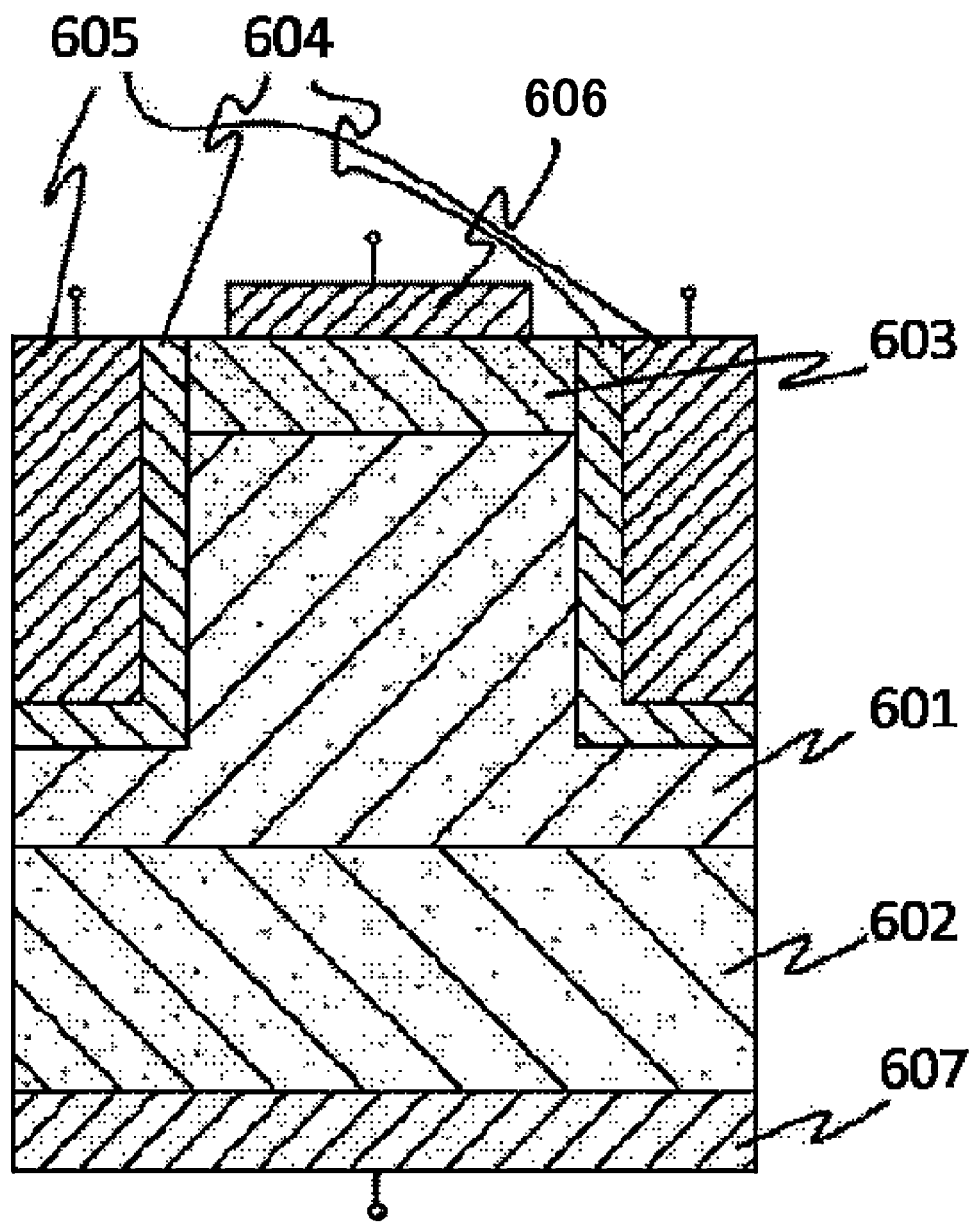

[FIG. 6]
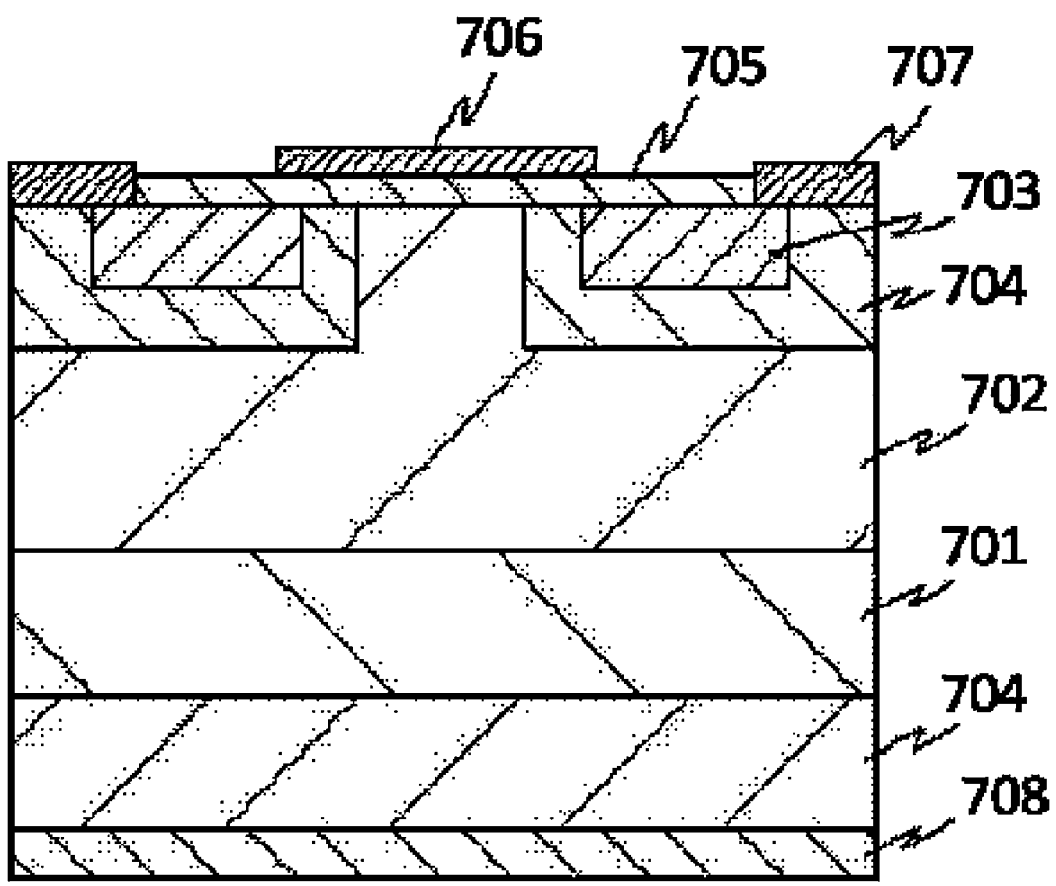

[FIG. 7]
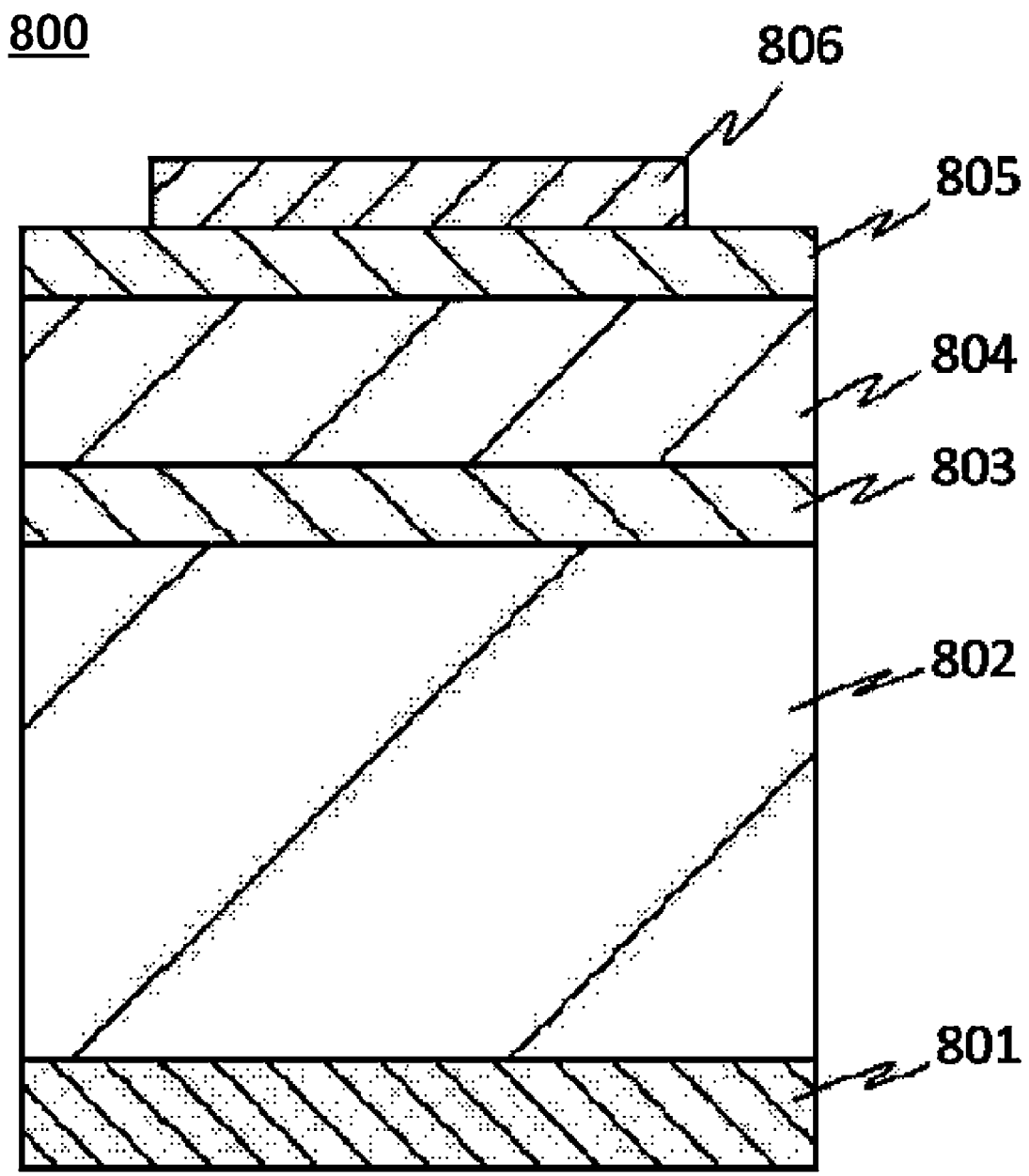

[FIG. 8]
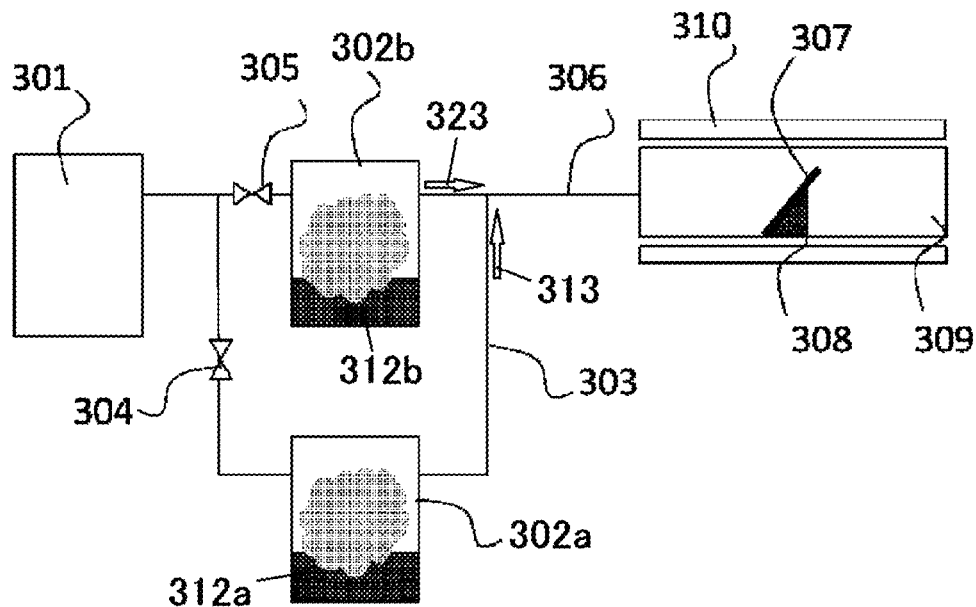
[FIG. 9]
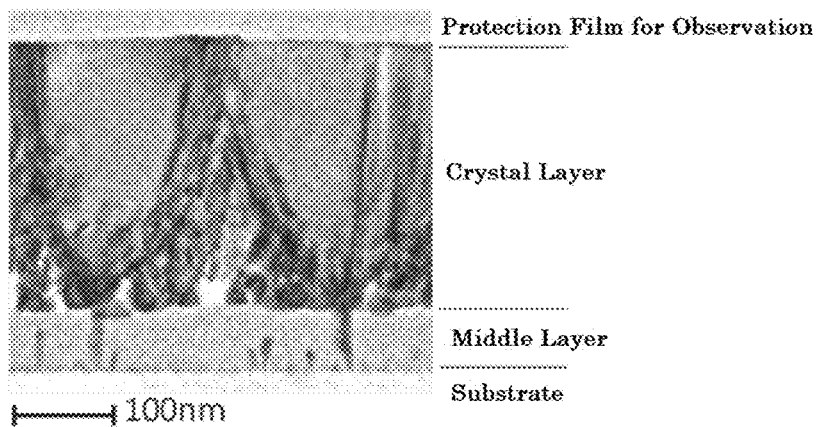
[FIG. 10]
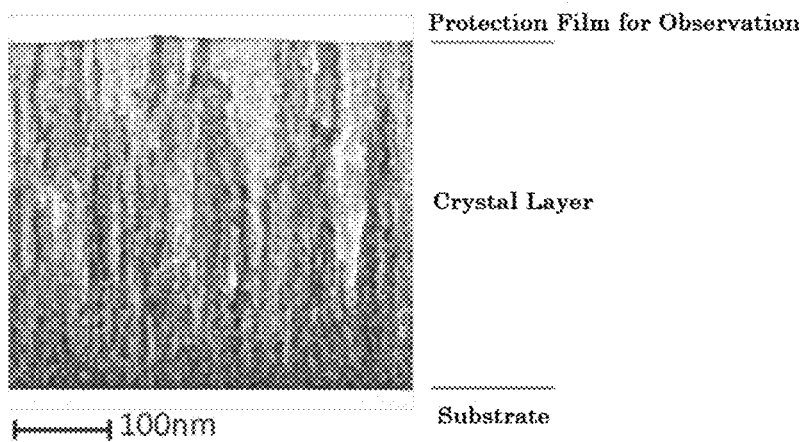

[FIG. 11]
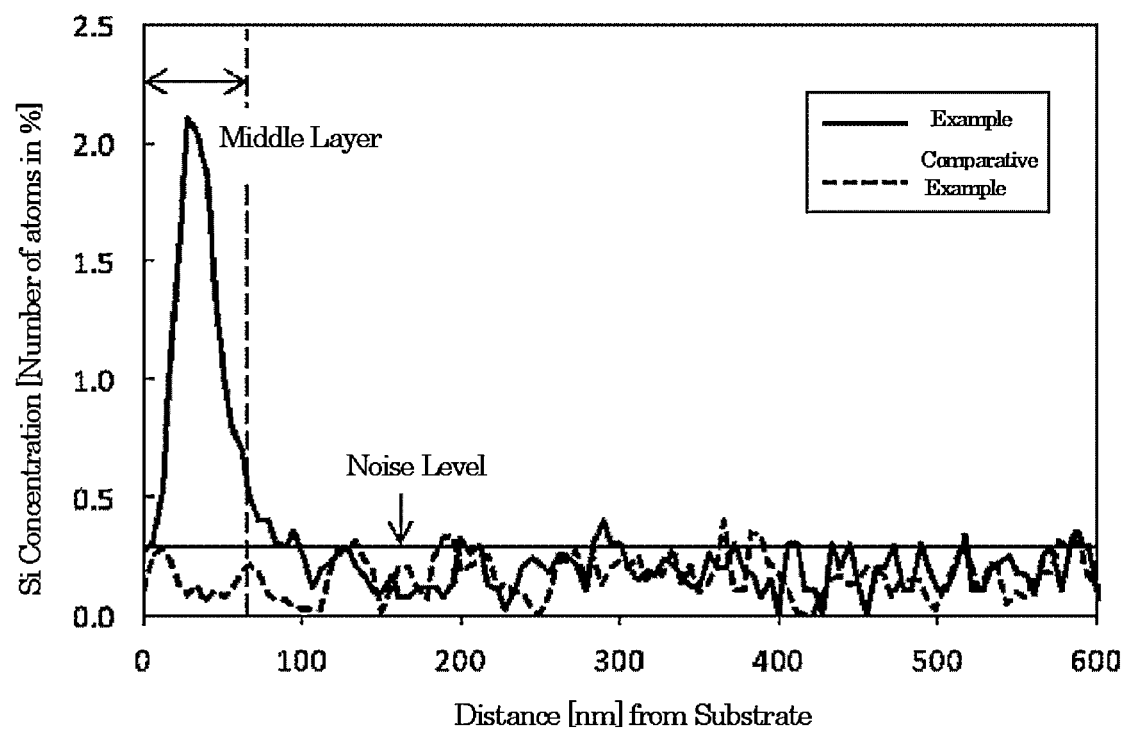

LAMINATE, SEMICONDUCTOR DEVICE, AND METHOD FOR MANUFACTURING LAMINATE

This is a Continuation of U.S. patent application Ser. No. 17/272,873 filed Mar. 2, 2021, which is a 371 International Application of PCT Application No. PCT/2019/035415 filed Sep. 9, 2019, which claims the benefit of Japanese Patent Application No. 2018-182714, filed Sep. 27, 2018. The disclosure of the prior applications is hereby incorporated by reference herein in its entirety.

TECHNICAL FIELD

The present invention relates to a laminate having a corundum-structured crystal layer, a semiconductor device using the laminate, and a method for manufacturing a laminate having a corundum-structured crystal layer.

BACKGROUND ART

As next-generation switching devices which can achieve high breakdown voltage, low loss, and high heat resistance, attention has been focused on semiconductor devices using gallium oxide ($\alpha$-$Ga_2O_3$) having large bandgap. Their applications to power semiconductor devices, such as inverter, and light-emitting or -receiving devices are expected.

Mist Chemical Vapor Deposition (Mist CVD. Hereinafter, this method may also be referred to as "mist CVD method") has been developed by which crystal is grown on a substrate using a raw material atomized into a mist form. This method enables production of gallium oxide ($\alpha$-$Ga_2O_3$) having a corundum structure (Patent Document 1). In this method, a gallium compound such as gallium acetylacetonate is dissolved in an acid such as hydrochloric acid to prepare a precursor. This precursor is atomized to generate raw-material fine particles. A gas mixture in which the raw-material fine particles are mixed with a carrier gas is supplied to a surface of a substrate having corundum structure, such as sapphire. The raw-material mist is allowed to react, so that a single-orientation gallium oxide thin film is epitaxially grown on the substrate.

Such hetero-epitaxial growth has problems, particularly lattice mismatch between materials of a substrate and a thin film, or crystal defect attributable to substrate quality. ELO (Epitaxial Lateral Overgrowth) has been known as a method for suppressing these crystal defects. In this technique, for example, an amorphous thin film is used to form a mask on a substrate surface so as to attain selective epitaxial growth from a partially exposed surface of the substrate and lateral growth on the mask. Hence, dislocation is stopped by the mask or is curved depending on the crystal orientation, so that defects in the epitaxial film are reduced. Patent Document 2 discloses an example in which an $\alpha$-$Ga_2O_3$ thin film is formed using $SiO_2$ as a mask.

CITATION LIST

Patent Literature

Patent Document 1: JP 5793732 B
Patent Document 2: JP 2016-100592 A

SUMMARY OF INVENTION

Technical Problem

High-quality corundum-structured crystals with sufficiently suppressed crystal defects are not obtained by the mist CVD method disclosed in Patent Document 1 mentioned above.

Meanwhile, as the mask for selective growth used in the ELO method described above in Patent Document 2, an amorphous film which is different in composition from the epitaxial film is employed. For this reason, such a mask is normally formed using a film forming apparatus which is different from an apparatus for forming a desired epitaxial film. Meanwhile, the mask is patterned generally by photolithography. Thus, if the epitaxial growth by the conventional ELO method is adopted to obtain a high-quality crystal thin film with suppressed crystal defect, the complicated process brings about problems of increased throughput and production cost.

The present invention has been made to solve the above-described problems. An object of the present invention is to provide a laminate having high-quality corundum-structured crystal with sufficiently suppressed crystal defects, and to provide a crystal production method that makes it possible to obtain a high-quality crystal thin film having few crystal defects at low cost.

Solution to Problem

The present invention has been made to achieve the object, and provides a laminate comprising:
  a crystal substrate;
  a middle layer formed on a main surface of the crystal substrate, the middle layer comprising a mixture of an amorphous region in an amorphous phase and a crystal region in a crystal phase having a corundum structure mainly made of a first metal oxide; and
  a crystal layer formed on the middle layer and having a corundum structure mainly made of a second metal oxide.

Such a laminate has a low-defect, high-quality corundum-structured crystal layer because the amorphous region in the middle layer stops extension of dislocation defect attributable to the substrate.

In this laminate, the crystal region may be an epitaxially grown layer from a crystal plane of the crystal substrate.

Thus, the crystal region of the middle layer serves as a seed crystal, resulting in a high-quality crystal layer according to the crystal orientation of the crystal substrate.

In the laminate, the middle layer may comprise the crystal region in a proportion of 1% or more in an arbitrary cross section of the middle layer which is cut perpendicularly to the main surface of the crystal substrate.

Thereby, the middle layer more effectively reduces dislocation defect extending from the crystal substrate, and the crystal layer has higher quality.

In the laminate, the middle layer may comprise the crystal region in a proportion of 4% or more and 25% or less in an arbitrary cross section of the middle layer which is cut perpendicularly to the main surface of the crystal substrate.

The resulting crystal layer has further higher quality.

In the laminate, the middle layer may have a thickness of 1 nm or more.

Thereby, the middle layer is capable of more effectively inhibiting dislocation defect extending from the crystal substrate, so that the crystal layer has higher quality.

In the laminate, the middle layer may have a thickness of 10 nm or more.

The resulting crystal layer has further higher quality.

In the laminate, the first metal oxide may mainly comprise an oxide containing any of aluminum, titanium, vanadium, chromium, iron, gallium, rhodium, indium, and iridium.

Moreover, the second metal oxide in the laminate may mainly comprise an oxide containing any of aluminum, titanium, vanadium, chromium, iron, gallium, rhodium, indium, and iridium.

Thereby, the laminate has the crystal layer that is excellent in electrical properties and more suitable for semiconductor devices.

In the laminate, the middle layer may further comprise silicon.

This enables more reliable formation of the middle layer that can form high-standard crystal layer.

In this laminate, the silicon concentration in the middle layer can be 0.5 at % or more, more preferably 1 at % or more and 10 at % or less.

This enables further reliable formation of the middle layer including a mixture of the crystal region and the amorphous region.

The laminate may further comprise a stress relief layer between the crystal substrate and the middle layer.

This further improves the crystallinity of the crystal region in the middle layer, and further improves the crystallinity of the crystal layer.

Herein, a semiconductor device comprising at least a semiconductor layer and an electrode can be provided, wherein the semiconductor layer comprises at least a portion of the above-described laminate.

Accordingly, the semiconductor device has higher performance.

The present invention can provide a method for manufacturing a laminate, comprising steps of:

forming a first mixture gas in which an atomized first metal oxide precursor, a carrier gas, and silicon are mixed;

forming a middle layer by supplying the first mixture gas onto a heated crystal substrate, wherein the middle layer contains a mixture of an amorphous region in an amorphous phase and a crystal region in a crystal phase having a corundum structure mainly made of a first metal oxide;

forming a second mixture gas in which an atomized second metal oxide precursor and a carrier gas are mixed; and forming a crystal layer on the middle layer by supplying the second mixture gas onto the heated crystal substrate, wherein the crystal layer has a corundum structure mainly made of a second metal oxide.

Such a method for manufacturing a laminate does not require dedicated mask formation, and can easily form a high-quality corundum-structured crystal layer at low cost.

In this method for manufacturing a laminate, in the step of forming the first mixture gas, the silicon may be added while the atomized first metal oxide precursor and the carrier gas are being conveyed toward the crystal substrate.

This enables simple formation of the middle layer containing a mixture of the crystal region and the amorphous region.

In this method for manufacturing a laminate, the silicon may be added while the atomized first metal oxide precursor and the carrier gas are conveyed through a pipe made of a silicone resin.

This enables simpler formation of the middle layer containing a mixture of the crystal region and the amorphous region.

In the method for manufacturing a laminate, supply amount of the first mixture gas can be changed in the step of forming the middle layer.

This enables easy control of the crystal-region proportion in the middle layer and the thickness of the middle layer.

Advantageous Effects of Invention

As described above, the present invention makes it possible to provide a laminate having a high-quality corundum-structured crystal layer with suppressed crystal defect. Moreover, the present invention enables simple and low-cost production of the laminate having a high-quality corundum-structured crystal layer.

BRIEF DESCRIPTION OF DRAWINGS

FIG. 1 is a view showing an embodiment of a laminate structure according to the present invention.

FIG. 2 is a view showing another embodiment of the laminate structure according to the present invention.

FIG. 3 is a view showing an example of a Schottky barrier diode (SBD) according to the present invention.

FIG. 4 is a view showing an example of a high electron mobility transistor (HEMT) according to the present invention.

FIG. 5 is a view showing an example of a metal-oxide-semiconductor field-effect transistor (MOSFET) according to the present invention.

FIG. 6 is a view showing an example of an insulated gate bipolar transistor (IGBT) according to the present invention.

FIG. 7 is a view showing an example of a light-emitting device diode (LED) according to the present invention.

FIG. 8 is a view showing an embodiment of a mist CVD apparatus used in a method for manufacturing a laminate according to the present invention.

FIG. 9 is a view showing a TEM image of Example.

FIG. 10 is a view showing a TEM image of Comparative Example.

FIG. 11 is a graph showing silicon concentration distributions in laminates of Example and Comparative Example.

DESCRIPTION OF EMBODIMENTS

Hereinafter, the present invention will be described in detail, but the present invention is not limited thereto.

As noted above, there is a demand for a high-quality corundum-structured crystal with sufficiently suppressed crystal defect.

The present inventor and colleagues have earnestly studied this problem, and consequently conceived a laminate including: a crystal substrate; a middle layer formed on a main surface of the crystal substrate, the middle layer containing a mixture of an amorphous region in an amorphous phase and a crystal region in a crystal phase having a corundum structure mainly made of a first metal oxide; and a crystal layer formed on the middle layer and having a corundum structure mainly made of a second metal oxide. The inventor has found that such laminate has a low-defect, high-quality corundum-structured crystal layer. These findings have led to the completion of the present invention.

Moreover, there is a demand for a method for manufacturing a laminate at low cost, the laminate having high-quality corundum-structured crystal with few crystal defects, as noted above.

The present inventor and colleagues have earnestly studied this problem, and consequently conceived a method for manufacturing a laminate, including steps of: forming a first mixture gas in which an atomized first metal oxide precursor, a carrier gas, and silicon are mixed; forming a middle layer by supplying the first mixture gas onto a heated crystal substrate, so that the middle layer contains a mixture of an amorphous region in an amorphous phase and a crystal region in a crystal phase having a corundum structure mainly made of a first metal oxide; forming a second mixture gas in which an atomized second metal oxide precursor and a carrier gas are mixed; and forming a crystal layer on the middle layer by supplying the second mixture gas onto the heated crystal substrate, so that the crystal layer has a corundum structure mainly made of a second metal oxide. The inventor has found that high-quality crystal thin films with few crystal defects can be obtained at low cost by this method for manufacturing a laminate. These findings have led to the completion of the present invention.

Hereinbelow, the description will be given with reference to the drawings.

FIG. 1 shows a laminate 100 according to the present invention. The laminate 100 includes: a crystal substrate 101; a middle layer 102 formed on a main surface of the crystal substrate 101, the middle layer 102 containing a mixture of a crystal region 102a in a crystal phase having a corundum structure mainly made of a first metal oxide, and an amorphous region 102b in an amorphous phase; and a crystal layer 103 formed on the middle layer 102 and having a corundum structure mainly made of a second metal oxide. Multiple columnar crystal regions 102a are formed randomly, and the amorphous region 102b is formed to fill a gap between the crystal regions 102a. Moreover, the crystal layer 103 is formed by epitaxial growth from the crystal regions 102a.

The crystal substrate 101 may be a known substrate and is not particularly limited, as long as the substrate contains crystal as the main component. The crystal substrate 101 may be any of an insulator substrate, an electro-conductive substrate, and a semiconductor substrate. Alternatively, the crystal substrate 101 may be a single crystal substrate or polycrystalline substrate. In view of quality and cost, a sapphire substrate is preferably used, for example.

Examples of the usable sapphire substrate include c-plane sapphire substrate, m-plane sapphire substrate, a-plane sapphire substrate, etc. Further, the sapphire substrate may have an off-angle. The off-angle is not particularly limited, but is preferably 0° to 15°. Incidentally, the thickness of the crystal substrate is not particularly limited, but is preferably approximately 200 to 800 μm in view of handleability and cost.

Herein, the metal element constituting the first metal oxide may be the same as or different from one constituting the second metal oxide. Additionally, the phrase "mainly made of a first metal oxide" means that a dopant, inevitable impurities, etc. may be present besides the first metal oxide, and indicates that the content of the first metal oxide is about 50% or more, for example. The same applies to the second metal oxide.

In the example illustrated in FIG. 1, the middle layer 102 is directly formed on the crystal substrate 101, but the middle layer may be formed on another layer that is formed on the crystal substrate. Particularly, when the lattice mismatch between the crystal substrate and the crystal region causes a problem, a stress relief layer, for example, can be provided between the crystal substrate 101 and the middle layer 102.

FIG. 2 shows a laminate 200 provided with a stress relief layer 204. Like the laminate 100 shown in FIG. 1, the laminate 200 includes: a crystal substrate 201; a middle layer 202 containing a mixture of a crystal region 202a and an amorphous region 202b in an amorphous phase; and a crystal layer 203 formed on the middle layer 202. Further, the stress relief layer 204 is provided between the crystal substrate 201 and the middle layer 202. This can further improve the crystallinity of the crystal region 202a in the middle layer 202, and consequently can further improve the crystallinity of the crystal layer 203.

The stress relief layer 204 is preferably formed to relieve the lattice mismatch between the crystal substrate 201 and the crystal region 202a, for example. In this case, values of the lattice constant of the stress relief layer 204 preferably vary in a continuous or stepwise manner in a growth direction of the stress relief layer 204 from a similar or equivalent value to that of the lattice constant of the crystal substrate 201 to a similar or equivalent value to that of the lattice constant of the crystal region 202a. For example, in a case where a middle layer containing an α-$Ga_2O_3$ crystal region is formed on an $Al_2O_3$ substrate, the stress relief layer 204 is preferably formed from $(Al_xGa_{1-x})_2O_3$ ($0 \leq x \leq 1$) such that the value of x is decreased from the crystal substrate 201 side to the middle layer 202 side.

Hereinbelow, description will be given of common aspects between the laminate 100 shown in FIG. 1 and the laminate 200 shown in FIG. 2.

The amorphous regions 102b, 202b in the middle layers 102, 202 particularly have an effect of preventing spread of dislocation defect or the like attributable to the crystal substrate. The crystal regions 102a, 202a function as seed crystals of the crystal layers 103, 203.

The processes of forming the crystal layers 103, 203 may involve not only epitaxial growth from the crystal regions 102a, 202a, but also crystal growth from nuclei formed on surfaces of the amorphous regions 102b, 202b in the middle layers 102, 202. Unlike the epitaxial growth from the crystal regions 102a, 202a, the crystal grown from the nuclei formed on the surfaces of the amorphous regions 102b, 202b has random crystal orientations. For this reason, it is preferable to set ratios of the amorphous regions 102b, 202b and the crystal regions 102a, 202a within an appropriate range in order to form the crystal layers 103, 203 with higher quality. Hence, in arbitrary cross sections cut perpendicularly to each main surface of the crystal substrates 101, 201, the middle layers 102, 202 preferably contain the crystal regions 102a, 202a in a proportion of 1% or more, more preferably 4% or more and 25% or less. Note that this proportion is based on areas of the regions in each cross section.

The crystal layers 103, 203 can have higher quality when the proportions of the crystal regions 102a, 202a in the middle layers 102, 202 are within such ranges.

Moreover, the middle layers 102, 202 each have a thickness of preferably 1 nm or more, more preferably 10 nm or more. When the thickness of the middle layers 102, 202 is within such ranges, the effect of preventing spread of dislocation defect etc. attributable to the crystal substrates can be enhanced.

In the middle layers 102, 202, the metal oxide is not particularly limited, as long as it can have a corundum structure. The metal oxide can be, for example, mainly made of an oxide containing any of aluminum, titanium, vanadium, chromium, iron, gallium, rhodium, indium, and iridium; more specifically, $Al_2O_3$, $Ti_2O_3$, $V_2O_3$, $Cr_2O_3$, $Fe_2O_3$, $Ga_2O_3$, $Rh_2O_3$, $In_2O_3$, or $Ir_2O_3$. Alternatively, the metal oxide can be a binary metal oxide shown by $(A_xB_{1-x})_2O_3$ ($0<x<1$), where A and B represent two elements selected from the aforementioned metal elements, or a ternary metal oxide shown by $(Al_xB_yC_{1-x-y})_2O_3$ ($0<x<1$, 0<y<1), where A, B, and C represent three elements selected from the aforementioned metal elements.

Additionally, the middle layers 102, 202 preferably contain silicon. Incorporating silicon in the middle layers 102, 202 enables more reliable formation of the middle layers 102, 202 containing mixtures of the crystal regions 102a, 202a and the amorphous regions 102b, 202b.

In this case, the silicon concentration can be 0.5 at % or more, more preferably 1 at % or more and 10 at % or less. When the silicon concentration is 0.5 at % or more, the amorphous regions 102b, 202b can be more reliably formed. Meanwhile, when the silicon concentration is 10% or less, the crystal regions 102a, 202a can be more reliably formed.

Note that it is found that in the middle layers 102, 202, the oxygen proportion is higher than the stoichiometry of the metal oxide for forming the middle layers 102, 202. Based on this, presumably, silicon added to the middle layers 102, 202 forms silicon oxide, and functions to disturb the crystal structure on the crystal substrate surface below the middle layer, thereby promoting the formation of the amorphous region.

In the crystal layers 103, 203, the metal oxide is not particularly limited, as long as it can have a corundum structure. The metal oxide can be, for example, mainly made of an oxide containing any of aluminum, titanium, vanadium, chromium, iron, gallium, rhodium, indium, and iridium; more specifically, $Al_2O_3$, $Ti_2O_3$, $V_2O_3$, $Cr_2O_3$, $Fe_2O_3$, $Ga_2O_3$, $Rh_2O_3$, $In_2O_3$, or $Ir_2O_3$. Alternatively, the metal oxide can be a binary metal oxide shown by $(A_xB_{1-x})_2O_3$ (0<x<1), where A and B represent two elements selected from the aforementioned metal elements, or a ternary metal oxide shown by $(Al_xB_yC_{1-x-y})_2O_3$ (0<x<1, 0<y<1), where A, B, and C represent three elements selected from the aforementioned metal elements.

Further, the crystal layers 103, 203 each may have a monolayer structure made of the metal oxide, or may have a stacked structure of multiple crystal films having different compositions and components such as dopant.

When the metal oxide in the middle layers 102, 202 and/or the crystal layers 103, 203 is such metal oxide as described above, the resulting crystal layer or laminate is more suitable for semiconductor devices.

Further, each of the crystal substrates 101, 201, the middle layers 102, 202, and the crystal layers 103, 203 in the inventive laminates 100, 200 may be doped with an impurity to impart electric conductivity. As such an impurity, for example, when the metal oxide contains at least gallium, any of silicon, germanium, tin, magnesium, and copper, or a combination thereof can be suitably used. The concentration of the impurity added by the doping can be appropriately set depending on the target final product. The concentration can be, for example, $1\times10^{16}$ $cm^{-3}$ or more and $8\times10^{22}$ $cm^{-3}$ or less. Moreover, the crystal layers 103, 203 can be stacked layers of multiple crystal layers doped at different impurity concentrations.

The crystal layer in the inventive laminate has low defect density, and is excellent in electrical properties and industrially useful. Such a laminate is suitably usable for semiconductor devices and so forth, particularly useful for power devices. Moreover, the crystal layer formed as a portion of the laminate may be used as it is (i.e., in the laminate), or may be applied to a semiconductor device or the like after, for example, separated from the crystal substrate and so on by a known method.

Meanwhile, semiconductor devices can be classified into: horizontal element (horizontal device) having an electrode formed on one side of a semiconductor layer; and vertical element (vertical device) having electrodes respectively on both of top and bottom sides of a semiconductor layer. At least a portion of the inventive laminate is suitably usable in both of horizontal and vertical devices. The inventive laminate is particularly preferably used in a vertical device.

Examples of the semiconductor device include Schottky barrier diode (SBD), metal-semiconductor field-effect transistor (MESFET), high electron mobility transistor (HEMT), metal-oxide-semiconductor field-effect transistor (MOSFET), junction field-effect transistor (JFET), insulated gate bipolar transistor (IGBT), light-emitting diode (LED), etc.

The crystal layer obtained from the inventive laminate is applicable to n type semiconductor layers (such as n+ type semiconductor and n− semiconductor layer). Suitable examples thereof will be described using the drawings, but the present invention is not limited to these examples.

Note that semiconductor devices exemplified below may further include other layers (e.g., insulator layer and conductor layer) and the like depending on the specification or purpose. A middle layer, a buffer layer, and the like may be added or omitted as appropriate.

FIG. 3 is an example of a Schottky barrier diode (SBD). An SBD 400 includes: an n− type semiconductor layer 401a doped at relatively low concentration; an n+ type semiconductor layer 401b doped at relatively high concentration; a Schottky electrode 402; and an ohmic electrode 403.

Materials of the Schottky electrode 402 and the ohmic electrode 403 may be known electrode materials. Examples of the electrode materials include metals, such as aluminum, molybdenum, cobalt, zirconium, tin, niobium, iron, chromium, tantalum, titanium, gold, platinum, vanadium, manganese, nickel, copper, hafnium, tungsten, iridium, zinc, indium, palladium, neodymium, and silver; alloys thereof; metal oxide conductive films, such as tin oxide, zinc oxide, rhenium oxide, indium oxide, indium-tin oxide (ITO), and indium-zinc oxide (IZO); organic electro-conductive compounds, such as polyaniline, polythiophene, and polypyrrole; mixtures and laminates thereof; etc.

The Schottky electrode 402 and the ohmic electrode 403 can be formed by known means, such as, for example, a vacuum deposition method or a sputtering method. More specifically, for example, when two of the above-described metals are used as a first metal and a second metal to form a Schottky electrode, a layer made of the first metal and a layer made of the second metal are stacked, and the layer made of the first metal and the layer made of the second metal are patterned by utilizing photolithography technique, so that the Schottky electrode can be formed.

When a reverse bias is applied to the SBD 400, a depletion layer (not shown) expands in the n− type semiconductor layer 401a, so that the SBD has a high breakdown voltage. Meanwhile, when a forward bias is applied, electrons flow from the ohmic electrode 403 to the Schottky electrode 402. Thus, the SBD of the present invention is excellent for high breakdown voltage and large current, the switching speed is fast, and the breakdown voltage and reliability are also excellent.

FIG. 4 is an example of a high electron mobility transistor (HEMT). A HEMT 500 includes an n type semiconductor layer 501 with wide band gap, an n type semiconductor layer 502 with narrow band gap, an n+ type semiconductor layer 503, a semi-insulator layer 504, a buffer layer 505, a gate electrode 506, a source electrode 507, and a drain electrode 508.

FIG. 5 is an example of a metal-oxide-semiconductor field-effect transistor (MOSFET). A MOSFET 600 includes an n− type semiconductor layer 601, an n+ type semiconductor layers 602 and 603, a gate insulator film 604, a gate electrode 605, a source electrode 606, and a drain electrode 607.

FIG. 6 is an example of an insulated gate bipolar transistor (IGBT). An IGBT 700 includes an n type semiconductor layer 701, an n− type semiconductor layer 702, an n+ type semiconductor layer 703, a p type semiconductor layer 704, a gate insulator film 705, a gate electrode 706, an emitter electrode 707, and a collector electrode 708.

FIG. 7 is an example of a light-emitting diode (LED). An LED 800 includes a first electrode 801, an n type semiconductor layer 802, a light-emitting layer 803, a p type semiconductor layer 804, a transparent electrode 805, and a second electrode 806.

Examples of the material of the transparent electrode 805 include oxide electro-conductive materials containing indium or titanium, etc. More specific examples thereof include $In_2O_3$, ZnO, $SnO_2$, $Ga_2O_3$, $TiO_2$, and $CeO_2$; mixed crystals of two or more thereof; materials doped therewith; etc. When these materials are disposed by known means such as sputtering, the transparent electrode 805 can be formed. Additionally, after the transparent electrode 805 is formed, thermal anneal may be performed to make the transparent electrode 805 transparent.

Examples of the material of the first electrode 801 and the second electrode 806 include metals, such as aluminum, molybdenum, cobalt, zirconium, tin, niobium, iron, chromium, tantalum, titanium, gold, platinum, vanadium, manganese, nickel, copper, hafnium, tungsten, iridium, zinc, indium, palladium, neodymium, and Ag; alloys thereof; metal oxide conductive films, such as tin oxide, zinc oxide, rhenium oxide, indium oxide, indium-tin oxide (ITO), and indium-zinc oxide (IZO); organic electro-conductive compounds, such as polyaniline, polythiophene, and polypyrrole; mixtures thereof; etc. The method of forming the electrode films is not particularly limited. The electrodes can be formed by a method appropriately selected in consideration of the suitability to the material and so forth. Examples of the method includes printing method; wet processes, such as spraying and coating methods; physical processes, such as vacuum deposition method, sputtering method, and ion plating method; chemical processes, such as CVD and plasma CVD methods; etc.

Next, an example of a method for manufacturing the inventive laminate shown in FIG. 1 will be described with reference to FIG. 8. However, the present invention is not limited thereto.

FIG. 8 shows an example of an apparatus used in the method for manufacturing a laminate according to the present invention. In the inventive method for manufacturing a laminate, a mist CVD apparatus 300 is used. First, a first metal oxide precursor 312a and a second metal oxide precursor 312b are accommodated as raw-material solutions in atomizers 302a, 302b, respectively, and atomized to form mists (also referred to as "mist generation") by using known means. Examples of the first metal oxide precursor 312a and the second metal oxide precursor 312b include gallium solutions obtained by dissolving organometallic complexes (e.g., acetylacetonate complex etc.) of a metal or metal gallium in acid solutions; aqueous solutions of halides (e.g., fluoride, chloride, bromide, iodide, etc.); etc. The metal is not limited, as long as the metal can form a corundum structure as metal oxide crystal. Examples of the metal include aluminum, titanium, vanadium, chromium, iron, gallium, rhodium, indium, and iridium. Moreover, the metal contained in one of the first metal oxide precursor 312a and the second metal oxide precursor 312b may be identical to or different from the other.

The metal content in each raw-material solution is not particularly limited, and can be appropriately set depending on the purpose or specification. The metal content is preferably 0.001 mol % to 50 mol %, more preferably 0.01 mol % to 5 mol %.

In a case where electric conductivity is imparted to at least a portion of the laminate, doping may be performed. In this case, the impurity material is not particularly limited. For example, a complex or compound each containing silicon, germanium, tin, magnesium, or copper can be suitably used, when at least gallium is contained as the metal. Particularly, in a case where n type electric conductivity is imparted, tin halide is preferably used. Such impurity materials can be mixed and used in an amount of 0.1 to 20 at %, more preferably 1 to 10 at %, in the raw-material solution.

The solvent of the raw-material solution is not particularly limited, may be an inorganic solvent, such as water, may be an organic solvent, such as an alcohol, or may be a mixture solvent of an inorganic solvent with an organic solvent. Water is preferably used.

Further, the mist CVD apparatus 300 includes means for supplying a carrier gas 301. The carrier gas 301 is mixed with atomized raw-material solutions (metal oxide precursors) formed in the atomizers 302a, 302b, and conveyed to a film forming chamber 309.

The example illustrated in FIG. 8 shows a structure in which the atomizer 302b is connected to the film forming chamber 309 with a conveyance pipe 306, and a conveyance pipe (silicon supplemental pipe) 303 from the atomizer 302a merges with an intermediate portion of the conveyance pipe 306. Nevertheless, the conveyance pipe (silicon supplemental pipe) 303 and the conveyance pipe 306 may be connected to the film forming chamber 309 independently of each other. Incidentally, the conveyance pipe (silicon supplemental pipe) 303 will be described in detail later.

The carrier gas 301 is not particularly limited. For example, inert gases, such as nitrogen and argon, or reducing gases, such as hydrogen gas and forming gas, are suitably used besides air, oxygen, and ozone. Regarding the type of the carrier gas, one type or two or more types may be used. The flow rate of the carrier gas can be appropriately set depending on the size of the substrate and the volume of the film forming chamber, and can be approximately 0.01 to 40 L/minute.

In addition, although not shown, it is also possible to add a dilution gas to adjust the ratio between the atomized raw material and the carrier gas. The flow rate of the dilution gas can be appropriately set, and can be 0.1 to 10 times as high as that of the carrier gas per minute. The dilution gas may be supplied downstream of the atomizers 302a, 302b, for example. The dilution gas to be used may be the same as or different from the carrier gas.

The structure and so forth of the film forming chamber 309 are not particularly limited. A metal, such as aluminum or stainless steel, may be used. When a film is formed at a temperature higher than the heat-resistance temperatures of these metals, quartz or silicon carbide may be used. Inside or outside the film forming chamber 309, heating means 310 is provided to heat a crystal substrate 307.

Moreover, the crystal substrate 307 may be placed on a susceptor 308 disposed in the film forming chamber 309.
(Step of Forming First Mixture Gas)

First, a first mixture gas 313 is formed in which a carrier gas 301, an atomized first metal oxide precursor formed in the atomizer 302a, and silicon are mixed. In the example illustrated in FIG. 8, the first mixture gas 313 is formed by adding silicon while the carrier gas 301 and the atomized first metal oxide precursor are being conveyed toward the crystal substrate 307 placed in the film forming chamber 309. As the method of adding silicon during the conveyance, passing the carrier gas 301 and the atomized first metal oxide precursor through the conveyance pipe (silicon supplemental pipe) 303 to add silicon is simple and preferable. As the conveyance pipe (silicon supplemental pipe) 303, for example, a silicone-resin pipe mainly made of a silicone resin is usable. For example, methyl silicone rubber, vinyl-methyl silicone rubber, phenyl-methyl silicone rubber, and the like are suitably usable.

Alternatively, instead of using the conveyance pipe (silicon supplemental pipe) 303 to add silicon, it is also possible to adopt a method in which a silicon raw material is added to the carrier gas 301 in advance, or a silicon raw material is added into the atomizer 302a, for example. Nevertheless, adding silicon just through the conveyance pipe (silicon supplemental pipe) 303 as described above is quite an easy way of achieving the first-mixture-gas formation.

(Step of Forming Middle Layer)

The first mixture gas 313 formed in the above-described manner is conveyed onto the crystal substrate 307 which is placed on the susceptor 308 in the film forming chamber 309, and which has been heated by the heating means 310. Thus, a middle layer is formed which contains a mixture of an amorphous region in an amorphous phase and a crystal region in a crystal phase having a corundum structure mainly made of a first metal oxide.

Since a silicon compound such as a siloxane derived from the silicone resin is mixed in the first mixture gas 313 inside the conveyance pipe (silicon supplemental pipe) 303 in the conveyance process, this silicon presumably forms silicon oxide inside the middle layer during the middle layer formation, and partially disturbs the crystal structure of, for example, gallium oxide, so that the amorphous region is partially formed.

The supply of the first mixture gas 313 to the film forming chamber 309 is appropriately adjusted by opening and closing a valve 304, and stopped after the middle layer with a desired thickness is formed.

Here, while the middle layer is being formed, the supply amount of the first mixture gas 313 may be changed. This makes it possible to easily control the crystal region proportion in the middle layer and the thickness of the middle layer. Hence, the productivity improvement and low-cost production of the laminate are possible.

Note that, in FIG. 8, the valve 304 is disposed upstream of the atomizer 302a, but the arrangement is not limited thereto. The valve 304 may be disposed downstream of the atomizer 302a.

(Step of Forming Second Mixture Gas)

Further, a second mixture gas 323 is formed in which an atomized second metal precursor (mist) formed in the atomizer 302b and a carrier gas 301 are mixed. The second mixture gas 323 is formed in the same manner as in the first mixture gas, except that silicon is not added.

(Step of Forming Crystal Layer on Middle Layer)

The second mixture gas 323 formed as described above is conveyed onto the heated crystal substrate 307 placed on the susceptor 308 in the film forming chamber 309. Thereby, a crystal layer having a corundum structure mainly made of a second metal oxide is formed on the middle layer.

The second mixture gas 323 introduced in the film forming chamber 309 undergoes reaction on the crystal substrate 307 heated by the heat source 310 to thereby form the crystal layer in the film forming chamber 309.

The temperature of the crystal substrate 307 is appropriately set according to the raw material to be used and the target product to be formed. Nevertheless, when the middle layer is formed, the temperature is preferably 350° C. or more and 600° C. or less, more preferably 400° C. or more and 500° C. or less. Within such temperature ranges, the middle layer including a mixture of the crystal region and the amorphous region can be more reliably formed.

Moreover, when, for example, α-phase gallium oxide is formed as the crystal layer on the middle layer, the temperature is preferably 380° C. or more and 900° C. or less. With such a temperature range, the crystal layer of gallium oxide not in the β, phase but in the α phase can be more reliably formed.

The film formation may be performed under pressure, reduced pressure, or atmospheric pressure, preferably under atmospheric pressure in view of apparatus cost and productivity.

Note that the film thickness can be set by adjusting the film-formation time and the carrier-gas flow rate.

Furthermore, when the middle layer is formed, the mixture gas supplied to the film forming chamber 309 may be the first mixture gas 313 alone, or may be both of the first mixture gas 313 and the second mixture gas 323. When the first mixture gas 313 and the second mixture gas 323 are supplied simultaneously, for example, a total flow rate of the carrier gases flowing to the atomizers 302a and 302b is preferably within the above-described flow rate range. Note that, in the drawing, the valve 304 and a valve 305 are disposed upstream of the atomizers 302a, 302b, but may be disposed downstream of the atomizers 302a, 302b.

EXAMPLE

Hereinafter, the present invention will be described in detail by showing Example. However, the present invention is not limited thereto.

Example

A laminate was manufactured using a mist CVD apparatus similar to that in FIG. 8.

Two sprayers (sprayer A, sprayer B) serving as the atomizers and a film forming chamber made of quartz were prepared. The sprayer A was connected to the film forming chamber with a quartz pipe. The sprayer B was connected, through a pipe made of a silicone resin, to the quartz pipe connected to the sprayer A before the film forming chamber.

Next, an aqueous solution containing 0.02 mol/L of gallium acetylacetonate was mixed with hydrochloric acid with a concentration of 34% such that the volume ratio of the latter was 1%. The mixture was stirred with a stirrer for 60 minutes to obtain a precursor. With this precursor, the two sprayers (sprayer A, sprayer B) were filled.

Next, a c-plane sapphire substrate with a thickness of 0.45 mm was placed on a susceptor disposed in the film forming chamber, and heated such that the substrate temperature reached 450° C.

Next, with a 2.4-MHz ultrasonic transducer, ultrasonic vibration was propagated through water to the precursors in the sprayers A, B, so that the precursors were atomized (mists were generated).

Next, a nitrogen gas was added to the sprayer B at a flow rate of 5 L/min. The resulting mixture gas of the atomized precursor and the nitrogen gas was supplied to the reactor for 5 minutes, and a middle layer having a film thickness of approximately 70 nm was formed. Immediately thereafter, the nitrogen-gas supply to the sprayer B was stopped, and the mixture-gas supply to the reactor was stopped.

Next, a nitrogen gas was added to the sprayer A at a flow rate of 5 L/min. The resulting mixture gas of the mist and the nitrogen gas was supplied to the reactor for 30 minutes, and a crystal layer having a film thickness of approximately 300 nm of formed. Immediately thereafter, the nitrogen-gas supply to the sprayer A was stopped, and the mixture-gas supply to the reactor was stopped.

Next, the substrate heating was stopped. The substrate was cooled to around room temperature and taken out of the film forming chamber.

In the X-ray diffraction measurement, peak appeared at $2\theta=40.3°$. This confirmed that the prepared crystal layer of the laminate was α-phase $Ga_2O_3$.

Then, the prepared laminate was analyzed with a transmission electron microscope (TEM). Moreover, the silicon concentration in the laminate was analyzed by energy-dispersive X-ray spectroscopy (EDX).

Comparative Example

A crystal layer was formed using the apparatus used in Example from which the sprayer B and the silicone resin pipe had been removed.

First, the sprayer A was filled with a precursor equivalent to that used in Example.

Next, a c-plane sapphire substrate with a thickness of 0.45 mm was placed on a susceptor disposed in the film forming chamber, and heated such that the substrate temperature reached 450° C.

Next, with the 2.4-MHz ultrasonic transducer, ultrasonic vibration was propagated through water to the precursor in the sprayer A, so that the precursor was atomized (mist was generated).

Next, a nitrogen gas was added to the sprayer A at a flow rate of 5 L/min. The resulting mixture gas of the mist and the nitrogen gas was supplied to the reactor for 35 minutes, and a crystal layer was formed. Immediately thereafter, the nitrogen-gas supply to the sprayer A was stopped, and the mixture-gas supply to the film forming chamber was stopped.

Next, the substrate heating was stopped. The substrate was cooled to around room temperature and taken out of the film forming chamber.

In the X-ray diffraction measurement, peak appeared at $2\theta=40.3°$. This confirmed that the prepared crystal layer was α-phase $Ga_2O_3$.

Then, the prepared laminate was analyzed with a transmission electron microscope (TEM). Moreover, the silicon concentration in the laminate was analyzed by EDX.

FIG. 9 and FIG. 10 show sectional TEM images of the laminates prepared in Example and Comparative Example, respectively. It can be seen that, in Example shown in FIG. 9, the middle layer including columnar crystal regions was formed on the substrate. In the middle layer of the sectional TEM image, dark columnar portions are crystal regions. Image analysis was conducted on the same sample at multiple positions in the TEM image. As a result, the proportion of the crystal region in middle layer was approximately 9.5%. It should be noted that no middle layer was formed in Comparative Example shown in FIG. 10.

Moreover, looking at the crystal layer in Example, it can be seen that the crystal layer on the middle layer had large grown crystal grains (whitish portions) utilizing as seed crystals the columnar crystals in the middle phase. In comparison with the crystal layer of Comparative Example shown in FIG. 10, it can be seen that crystal defects were considerably reduced, which were observed as black contrast extending in the film growth direction.

FIG. 11 shows concentration distributions of silicon atoms in the fields of view of FIGS. 9, 10. In Example (FIG. 9), in a region approximately 70 nm from the substrate surface where the middle layer abutted, approximately 2.0 at % of silicon was detected at its maximum. On the other hand, the silicon concentrations in the crystal layers of Example and Comparative Example were at the noise level and undetectable.

The above results have revealed that a low-defect, high-quality crystal layer (crystal film) is obtained according to the present invention in comparison with the conventional technique.

Moreover, in the present invention, since the middle layer and the crystal layer are formed using one apparatus, the low-defect, high-quality crystal layer (crystal film) can be obtained at quite low cost and high productivity in comparison with film formation using an additional apparatus for forming an ELO growth mask and film formation requiring photolithography process as in the conventional ELO method. Furthermore, since the present invention does not require an additional apparatus as described above, there is a low possibility that the crystal substrate is contaminated.

It should be noted that the present invention is not limited to the above-described embodiments. The embodiments are just examples, and any examples that substantially have the same feature and demonstrate the same functions and effects as those in the technical concept disclosed in claims of the present invention are included in the technical scope of the present invention.

The invention claimed is:

1. A laminate comprising:
   a crystal substrate;
   a middle layer formed on a main surface of the crystal substrate, the middle layer comprising a mixture of an amorphous region in an amorphous phase and a crystal region in a crystal phase having a corundum structure mainly made of a first metal oxide; and
   a crystal layer formed on the middle layer and having a corundum structure mainly made of a second metal oxide,
   wherein the crystal region is an epitaxially grown layer from a crystal plane of the crystal substrate,
   the middle layer further comprises silicon, and
   a silicon concentration in the middle layer is 0.5 at % or more.

2. The laminate according to claim 1, wherein the middle layer comprises the crystal region in a proportion of 1% or more in an arbitrary cross section of the middle layer which is cut perpendicularly to the main surface of the crystal substrate.

3. The laminate according to claim 1, wherein the middle layer has a thickness of 1 nm or more.

4. The laminate according to claim 1, wherein the first metal oxide mainly comprises an oxide containing any of aluminum, titanium, vanadium, chromium, iron, gallium, rhodium, indium, and iridium.

5. The laminate according to claim 1, wherein the second metal oxide mainly comprises an oxide containing any of aluminum, titanium, vanadium, chromium, iron, gallium, rhodium, indium, and iridium.

6. The laminate according to claim 1, further comprising a stress relief layer between the crystal substrate and the middle layer.

7. A semiconductor device comprising at least a semiconductor layer and an electrode, wherein
the semiconductor layer comprises at least a portion of the laminate according to claim 1.

8. A laminate comprising:
a crystal substrate;
a middle layer formed directly on a main surface of the crystal substrate or formed on another crystal layer that is formed on the crystal substrate, the middle layer comprising a mixture of an amorphous region in an amorphous phase and a crystal region in a crystal phase having a corundum structure mainly made of a first metal oxide; and
a crystal layer formed on the middle layer and having a corundum structure mainly made of a second metal oxide,
wherein the crystal region is an epitaxially grown crystal from a crystal plane of the crystal substrate or the another crystal layer,
the crystal layer comprises crystal grains which is epitaxially grown from the crystal region,
the middle layer further comprises silicon, and
a silicon concentration in the middle layer is 0.5 at % or more.

9. The laminate according to claim 8, wherein particle size of the crystal grains at a surface of the crystal layer is greater than particle size of the crystal grains at an interface between the crystal layer and the middle layer.

10. The laminate according to claim 8, wherein the middle layer comprises the crystal region in a proportion of 1% or more in an arbitrary cross section of the middle layer which is cut perpendicularly to the main surface of the crystal substrate.

11. The laminate according to claim 8, wherein the middle layer has a thickness of 1 nm or more.

12. The laminate according to claim 8, wherein the first metal oxide mainly comprises an oxide containing any of aluminum, titanium, vanadium, chromium, iron, gallium, rhodium, indium, and iridium.

13. The laminate according to claim 8, wherein the second metal oxide mainly comprises an oxide containing any of aluminum, titanium, vanadium, chromium, iron, gallium, rhodium, indium, and iridium.

14. The laminate according to claim 8, further comprising a stress relief layer between the crystal substrate and the middle layer.

15. A semiconductor device comprising at least a semiconductor layer and an electrode, wherein
the semiconductor layer comprises at least a portion of the laminate according to claim 8.

* * * * *